United States Patent [19]

Sieber

[11] 4,048,509

[45] Sept. 13, 1977

[54] GAMMA-IRRADIATION TREATMENT APPARATUS

[75] Inventor: Adolf Sieber, Winterthur, Switzerland

[73] Assignee: Sulzer Brothers Limited, Winterthur, Switzerland

[21] Appl. No.: 599,964

[22] Filed: July 29, 1975

[30] Foreign Application Priority Data

Aug. 21, 1974 Switzerland .................... 011443/74

[51] Int. Cl.[2] .............................................. H01J 37/00

[52] U.S. Cl. ..................................... 250/522; 250/493

[58] Field of Search ........... 250/493, 496, 497, 492 R, 250/453, 522, 454, 455

[56] References Cited

U.S. PATENT DOCUMENTS

| | | | |
|---|---|---|---|
| 3,673,409 | 6/1972 | Green | 250/453 |
| 3,809,897 | 5/1974 | Thomas | 250/328 |

*Primary Examiner*—Craig E. Church

*Attorney, Agent, or Firm*—Kenyon & Kenyon, Reilly, Carr & Chapin

[57] ABSTRACT

The radiation source mounting frame is raised and lowered by means of an elevator comprised of a block and tackle and a servo-motor having an output connected to a movable pulley block of the block and tackle. The elevator allows the mounting frame to be lowered at a rapid rate when necessary. The supply line for the pressure medium is also disposed near the end of the piston stroke so that the line can be throttled before the piston reaches the end of its stroke. This allows the final descent of the mounting frame to be retarded.

4 Claims, 2 Drawing Figures

GAMMA-IRRADIATION TREATMENT APPARATUS

This invention relates to a gamma-irradiation treatment apparatus and, more particularly, to a means for raising and lowering a radiation source mounting frame.

As is known, various types of gamma-irradiation treatment apparatus have utilized frames to carry radiation sources as well as various types of elevators for moving the frames between a screened position and an operative position. For example, use can be made of a manual or motor-operated rope winch to move a frame. However, a motor drive for a winch is relatively expensive particularly if regulations, such as safety regulations, require the drive to be associated with a lowering device which effects a retarded yet rapid descent of the frame into a screened position in the event of a disturbance in the operation of the irradiation apparatus.

Accordingly, it is an object of the invention to provide an elevator of simple construction for a radiation source frame in a gamma-irradiation treatment apparatus.

It is another object of the invention to provide an elevator which is reliable in operation for raising and lowering a radiation source mounting frame.

Briefly, the invention provides a gamma-irradiation treatment apparatus which has a frame with a means for mounting at least one radiation source therein with an elevator for moving the frame between a screened position and an operative irradiating position. This elevator includes a block and tackle and a servomotor. The block and tackle has a fixedly mounted, i.e. stationary, pulley block, a movably mounted pulley block and at least one run, for example of wire, cable or the like, which is connected to the frame and disposed over the pulley blocks. The servo-motor, in turn, has an output connected to the movably pulley block for moving this block relative to the fixedly mounted block so as to effect a movement of the frame.

The servo-motor may be constructed as a cylinder and piston of hydraulic or pneumatic type with the piston slidably mounted in the cylinder and secured to the movably mounted pulley block outside the cylinder. In order to move the piston within the cylinder, a line is connected to the cylinder for supplying pressure medium thereto. In addition, this line is connected at a distance from the end of the operative movement, i.e. stroke, of the piston so as to be throttled by the piston before the piston reaches the end of its operative movement. In this way, the servo-motor can cause a retarded descent of the radiation source frame when the line is in a discharge phase.

The use of the block and tackle allows a small operative movement of the servo-motor to be converted into a relatively large movement of the radiation source frame.

Figure 2:
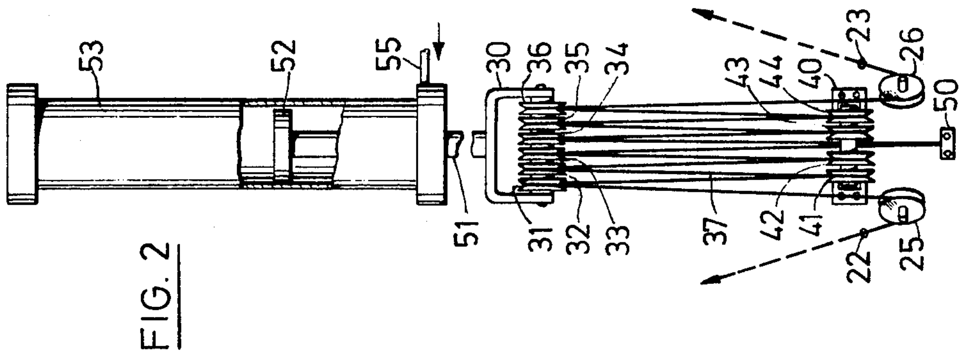
Figure 1:
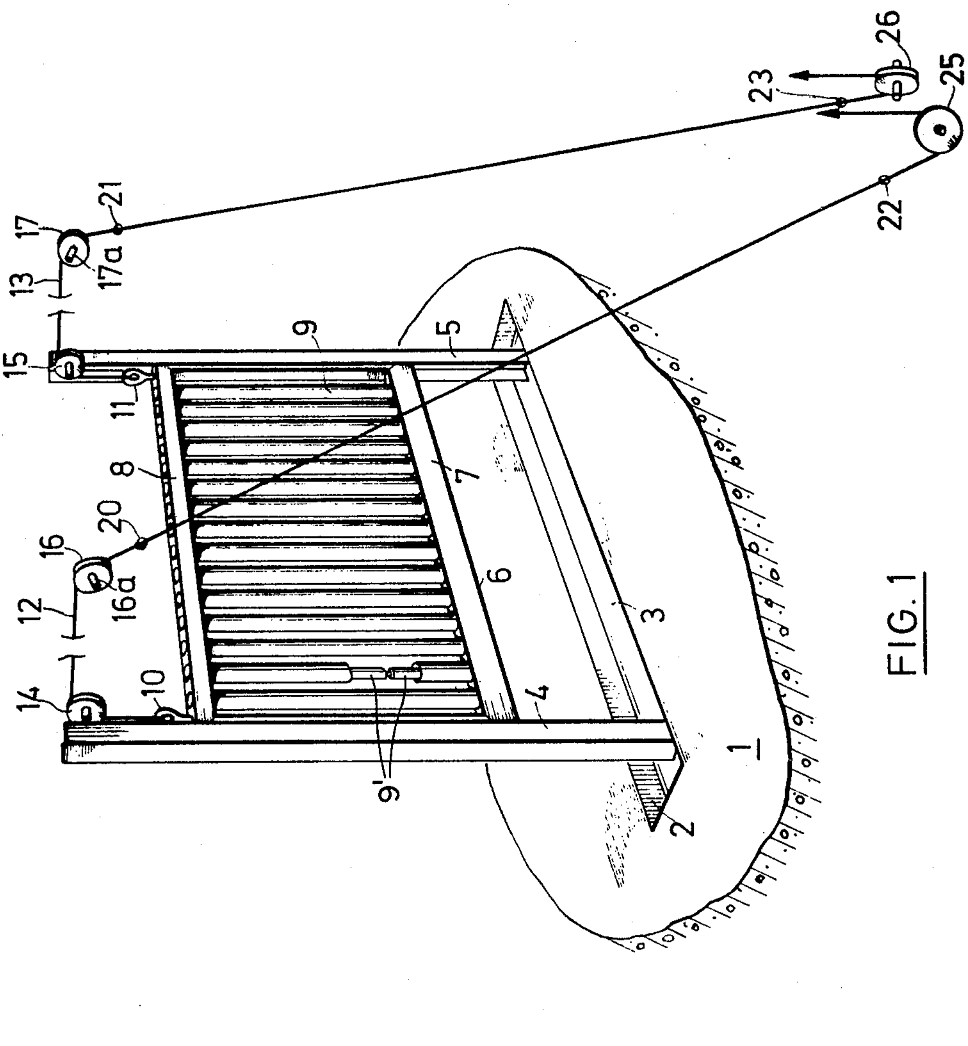

These and other objects and advantages of the invention will become more apparent from the following detailed description and appended claims taken in conjunction with the accompanying drawing in which:

FIG. 1 illustrates a perspective view of a radiation source frame of an irradiation apparatus; and FIG. 2 illustrates a view of an elevator according to the invention.

Referring to FIG. 1, the gamma-irradiation treatment apparatus includes, inter alia, an irradiation chamber, the floor 1 of which has a pit 2 filled to near the top with water 3. A pair of channel-shaped posts 4, 5 are vertically disposed in the pit 2 with concave sides facing one another.

A rectangular frame 6 is mounted for sliding in the guideway formed by the posts 4, 5 so as to be moved into and out of the pool of water in the pit 2. The frame 6 includes horizontal sides 7, 8 which are interconnected by vertical sleeves or tubes 9 which are open at the top. These sleeves 9 act as a means for mounting gamma radiation sources 9'. Two eyes 10, 11 are welded or otherwise secured to the horizontal side 8 of the frame 6.

An elevator is provided to raise and lower the frame 6 relative to the pit 2 from a screened non-irradiating position in the pit 2 within the pool of water to an irradiating position above the pit 2. The elevator includes two ropes 12, 13 which are secured, respectively, to the eyes 10, 11. As shown, the two ropes 12, 13 are deflected by means of two coaxial rollers 14, 15 from the vertical into the horizontal and are further deflected by means of two rollers 16, 17 having skew spindles 16*a*, 17*a* respectively. The ropes 12, 13 each enter at places 20, 21, respectively, into a passage of a front screening wall (not shown). The ropes 12, 13 issue from their passages at places 22, 23 of the screening wall and are then returned to a vertical orientation by means of two rollers 25, 26 which are disposed outside the irradiation chamber.

Referring to FIG. 2, the elevator further includes a block and tackle 37 and a servo-motor. The block and tackle 37 includes a movably mounted pulley or roller block 30 composed of, for example six pulleys 31–36, and a fixedly mounted pulley or roller block 40 composed for example or four pulleys 41–44. The fixedly mounted block 40, as shown, may be secured in any suitable manner to a fixed support. The servo-motor is in the form of a piston 52 and cylinder 53, for example of hydraulic or pneumatic type. The servo-motor has an output in the form of a rod 51 secured to the piston 52. A line 55 is connected to the cylinder 53 to supply pressure medium, for example oil, below the piston 52 as viewed.

As shown in FIG. 2, the two vertical runs of the ropes 12, 13 run over the two outermost pulleys 31, 36 of the upper pulley block 30 and are deflected through 180° by the rollers 31, 36, then go over the outer two pulleys 41, 44 of the lower and stationary pulley block 40. From the pulleys of the block 40, the ropes 12, 13 return to the top pulley block 30 and run over the next innermost pulleys 32, 35 and are then given further deflection in the stationary block 40 by the pulleys 42, 43, then undergo a final change of direction on pulleys 33, 34 of block 30 and are finally anchored below in a fixedly mounted clamp 50.

Normally line 55 communicates via a three-way valve with the reservoir of an oil supply (not shown) and the piston 52, rod 51 and top block 30 are in their bottom end position, the top block 30 being at a minimum distance from the bottom stationary block 40 and the frame 8 being immersed deep in the water 3 in the pit 2. To operate the apparatus, line 55 is connected via the three-way valve to a supply connection of the oil supply and as oil enters the cylinder 53 below the piston 52, the piston 52, rod 51 and top pulley block 30 rise. This causes the frame 8 to rise out of the water in the pit 2 at six times the speed at which the piston 52 moves into an end position determined by an abutment (not shown) with which the piston 52 in the cylinder 53 cooperates.

Thus, a substantial movement of the frame 8, such as several meters, can be obtained for small movements of the piston 52.

In order to shut down the apparatus either as programmed or because of a fault, the line 55 is changed over to a discharge phase. The piston 52 then descends slowly, since the oil present in the bottom chamber of the cylinder 53 must be expelled through the line 55. To ensure a gentle stoppage of the frame 8, the place where the line 55 is connected to the wall of the cylinder 53 can be at height such that the piston 52 restricts the discharge cross-section of the line 55 before the piston 52 strikes the end of the cylinder 53, that is, before reaching the end of its operating movement.

Thus, a small movement of the piston 52 causes a corresponding movement of the movable pulley block 30 and a greater movement of the runs of the ropes 12, 13 and the frame 8. That is, as the piston 52 moves at a predetermined rate, the frame 8 moves at a greater rate of movement.

Of course, a block and tackle associated with just a single wire rope can be used instead of a block and tackle having two wire ropes. If only a single wire rope is used, the radiation source frame 8 is suspended on just one rope which forks possibly before being secured to the radiation source frame.

Also, a servo-motor of some other kind, such as an electric servo-motor, can be used instead of a hydraulic or pneumatic servo-motor.

What is claimed is:

1. In an apparatus for treating goods with gamma radiation, the combination of a frame;

at least one gamma radiation source mounted in said frame for selectively irradiating the goods;

an elevator for moving said frame between a screened non-irradiating position and an irradiating position of said source with respect to the goods to be treated, said elevator including a block and tackle having a fixedly mounted pulley block, a movably mounted pulley block, and at least one run connected to said frame and disposed over said pulley blocks, and a servomotor including a cylinder and a piston slidably mounted in said cylinder and having a rod directly connected to said movably mounted pulley block for moving said latter pulley block relative to said fixedly mounted block whereby a small movement of said piston causes a corresponding movement of said movable pulley block and a greater movement of said run and said frame.

2. In an apparatus as set forth in claim 1 wherein said piston is secured to said movably mounted pulley block outside said cylinder.

3. In an apparatus as set forth in claim 2 which further includes a line connected to said cylinder for supplying pressure medium to said cylinder, said line being connected at a distance from the end of the operative movement of said piston so as to be throttled by said piston before said piston reaches the end of said operative movement.

4. In an apparatus as set forth in claim 1 wherein said screened non-irradiating position includes a pool of water to receive said frame.

* * * * *